(12) United States Patent
Sin et al.

(10) Patent No.: US 6,639,291 B1
(45) Date of Patent: Oct. 28, 2003

(54) SPIN DEPENDENT TUNNELING BARRIERS DOPED WITH MAGNETIC PARTICLES

(75) Inventors: Kyusik Sin, Pleasanton, CA (US); Shin Funada, Pleasanton, CA (US); Hugh Craig Hiner, Fremont, CA (US); Hua-Ching Tong, San Jose, CA (US); Xizeng Shi, Fremont, CA (US)

(73) Assignee: Western Digital (Fremont), Inc., Fremont, CA (US)

( * ) Notice: Subject to any disclaimer, the term of this patent is extended or adjusted under 35 U.S.C. 154(b) by 28 days.

(21) Appl. No.: 10/071,796

(22) Filed: Feb. 6, 2002

(51) Int. Cl.7 .............................................. H01L 29/72
(52) U.S. Cl. ....................... 257/427; 257/295; 257/421; 257/429
(58) Field of Search ................................ 257/427, 421, 257/429, 295

(56) References Cited

U.S. PATENT DOCUMENTS

2003/0035253 A1 * 2/2003 Lin .............................. 257/427

* cited by examiner

Primary Examiner—Edward Wojciechowicz
(74) Attorney, Agent, or Firm—Mark Lauer

(57) ABSTRACT

A tunneling barrier for a spin dependent tunneling (SDT) device is disclosed that includes a plurality of ferromagnetic particles. The presence of such particles in the tunneling barrier has been found to increase a magnetoresistance or ΔR/R response, improving the signal and the signal to noise ratio. Such an increased ΔR/R response also offers the possibility of decreasing an area of the tunnel barrier layer and/or increasing a thickness of the tunnel barrier layer. Decreasing the area of the tunnel barrier layer can afford improvements in resolution of devices such as MR sensors and increased density of devices such as of MRAM cells. Increasing the thickness of the tunnel barrier can afford improvements in manufacturing such as increased yield.

30 Claims, 3 Drawing Sheets

SPIN DEPENDENT TUNNELING BARRIERS DOPED WITH MAGNETIC PARTICLES

TECHNICAL FIELD

The present application relates to spin-dependent tunneling (SDT) devices. Such devices may be employed in many applications, including information storage and retrieval devices (e.g., electromagnetic transducers), solid-state memory for computers and digital processing systems (e.g., MRAM) and measurement and testing systems (e.g., magnetic field sensors).

BACKGROUND

Spin-dependent tunneling (SDT) effects are believed to depend upon a quantum mechanical probability of electron tunneling from one ferromagnetic (FM) electrode to another through a thin, electrically nonconductive layer, with the probability of tunneling depending upon the direction of magnetization of one electrode versus the other. SDT effects have many potential applications in magnetic field sensing devices, such as magnetic field sensors and information storage and retrieval devices. Read transducers for magnetic heads used in disk or tape drives, which may be termed magnetoresistive (MR) sensors, and solid-state memory devices such as magnetic random access memory (MRAM), are potential commercial applications for spin tunneling effects.

Elements of SDT devices include two FM electrodes and an electrically insulating tunneling barrier. One of the electrodes may include a pinned ferromagnetic layer and the other may include a free ferromagnetic layer. The pinned layer typically consists of a FM layer that has its magnetic moment stabilized by a pinning structure. The pinning structure may be an antiferromagnetic (AFM) layer that adjoins the pinned layer. The magnetic stabilization of the pinned layer may also be accomplished with a synthetic AFM structure that includes a transition metal such as ruthenium (Ru) in a sandwich between two FM layers, in which the transition metal layer has a precisely defined thickness that is typically less than 10 Å. The magnetization direction of the pinned FM layer is set upon deposition and annealing in a magnetic field. The free layer is typically a magnetically soft FM layer.

The free layer is designed to be magnetically decoupled from the pinned layer, so that the pinned layer does not hinder the response of the free layer to a magnetic field signal that is to be detected. The nonmagnetic tunneling barrier provides the magnetic decoupling between the pinned and free layers. The tunneling barrier is made of a thin dielectric layer, such as $Al_2O_3$ or AlN, which has a thickness typically in a range between 0.5 nm and 2 nm.

The tunnel barrier layer is designed to be a uniform and pinhole free dielectric film at the atomic scale, in order to avoid electrical shorting and ferromagnetic coupling through the pinholes. For applications involving tunneling magnetoresistive (TMR) heads, it is also desirable for the device resistance to be relatively low, in order to achieve a wide bandwidth and high frequency operation. The probability of electron tunneling through a tunnel barrier increases exponentially as the barrier is made thinner, however, for thicknesses gless than 10 Å electrical shorting between the electrodes becomes increasingly problematic.

For example, a media-facing surface of MR sensors may be formed by lapping or polishing in a direction that traverses the tunnel barrier layer, which can cause dislodged electrode particles to bridge across a thin barrier. Similarly, conventional solid-state memory processing requires annealing at a relatively high temperature after formation of memory cells, which could in the case of MRAM devices cause diffusion of electrode materials into a tunnel barrier.

For a tunnel barrier material having a uniform specific resistance at each point, the overall resistance of the barrier layer is an exponential function of the thickness of the layer and inversely proportional to the area of the layer. For MR heads the area of the tunnel barrier layer is constrained, however, by the desired resolution of the head. Similarly, for MRAM applications the area of the tunnel barrier layer is constrained by the desired density of the memory cells.

The resistance and area product (RA product) is a figure of merit for SDT films, and is sensitively dependent upon the barrier thickness. Given the constraints upon the area of the devices, tunnel barrier layers may be as thin as several atomic layers. Another figure of merit for a SDT device is the magnetoresistance, which is the change in resistance divided by the resistance ($\Delta R/R$) of the device in response to a change in applied magnetic field. Since the noise of the device is related to the resistance, the magnetoresistance is also a measure of the signal to noise ratio (SNR) of the device.

SUMMARY

In accordance with an embodiment of the present disclosure, a tunneling barrier for a spin dependent tunneling (SDT) device includes a plurality of ferromagnetic particles. The presence of such particles in the tunneling barrier has been found to increase the magnetoresistance, also known as the $\Delta R/R$ response to an applied magnetic field, improving the signal and the signal to noise ratio. Such an increased $\Delta R/R$ response also offers the possibility of decreasing an area of the tunnel barrier layer. Decreasing the area of the tunnel barrier layer can afford improvements in resolution of devices such as MR sensors and increased density of devices such as of MRAM cells.

DETAILED DESCRIPTION OF THE PREFERRED EMBODIMENTS

Figure 1:
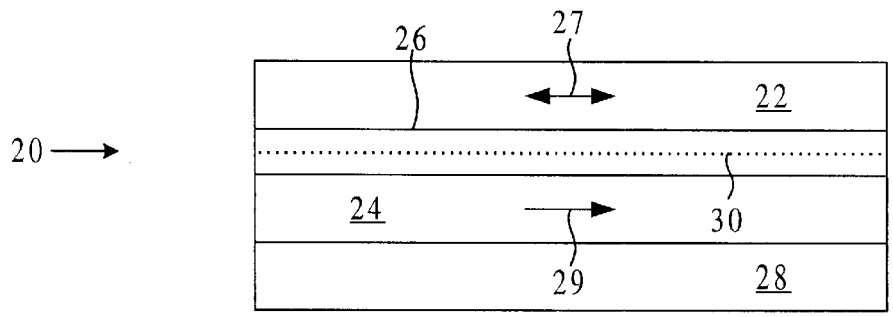
FIG. 1 is a cross-section of a SDT device having a plurality of magnetic particles disposed in a tunnel barrier layer that separates ferromagnetic layers having easy axes of magnetization substantially parallel to each other.

FIG. 1 shows a cross-section of a SDT device 20 having a plurality of magnetic particles 30 disposed in a tunnel barrier layer 26. The device 20 includes a first ferromagnetic (FM) layer 22 and second FM layer 24 separated by the tunnel barrier layer 26. A pinning structure 28 constrains the direction of magnetization of the second FM layer 24. In response to an applied magnetic field, the magnetic moment of the first FM layer 22 changes direction, as shown by arrow 27, while the magnetic moment of the second FM layer 24 is pinned, as shown by arrow 29. In this embodiment, which may for example be used in a MRAM device, an easy axis of magnetization of the first FM layer may be substantially parallel to that of the second FM layer 24, so that the second FM layer switches between substantially parallel and substantially antiparallel states. As long as the easy axes of magnetization of the first and second FM layers are more parallel than perpendicular, switching between two states is facilitated.

The pinning structure 28 may be an antiferromagnetic (AFM) layer that adjoins the pinned layer. The magnetic stabilization of the pinned layer may also be accomplished with a synthetic AFM structure involving a pair of FM layers exchange coupled across a thin precious metal layer. For example ruthenium (Ru) can be used in a sandwich of FM/Ru/FM in which the Ru layer has a thickness less than 10 Å. The magnetization direction of the pinned FM layer may be set upon deposition and annealing in a magnetic field.

Either or both of the first and second FM layers can be made primarily or entirely of metals such as iron (Fe), cobalt (Co), nickel (Ni) or alloys of such metals. Either or both of the first and second FM layers may also be made of half-metallic magnets such as $CrO_2$, $Fe_3O_4$, PtMnSb, $NiMnSbCo_2MnSi$ or $Sr_2FeMoO_6$.

The tunnel barrier layer 26 can be made primarily of dielectric materials such as $Al_2O_3$, AlN, $SiO_2$, $Si_3N_4$, TaO, $TaO_2$, $Ta_2O_5$, $HfO_2$. A preferred tunnel barrier material in one embodiment is $Al_2O_3$. The magnetic particles 30 can include Co, Ni or Fe atoms or molecules, or compound molecules such as CoFe, NiFe, CoNi or NiFeCo, for example. The magnetic moment of the particles is not fixed. A related disclosure of magnetic particles contained in a tunnel barrier layer can be found in the U.S. Patent Application entitled "Spin Dependent Tunnel Barriers Formed With A Magnetic Alloy," invented by the same inventors and filed on the same day as the present application, and incorporated by reference herein.

The thickness of the tunnel barrier layer 26 can vary significantly for different embodiments, and for one embodiment the thickness is in a range between about 4 Å and about 15 Å. The tunnel barrier layer 26 may itself be composed of plural dielectric layers with the magnetic particles disposed in at least one of the dielectric layers. Although the particles in that embodiment do not form a continuous layer that separates the dielectric layers, the average thickness of the layer of magnetic particles may be in a range between about 0.1 Å and about 3 Å. Individual magnetic particles in one embodiment may range between single atoms and molecules containing up to about sixteen ferromagnetic atoms. Care must be taken during fabrication to avoid having the magnetic particles act as conductors between the first and second FM layers 22 and 24, despite an overall tunnel barrier thickness that may be as little as several atomic layers.

Figure 2:
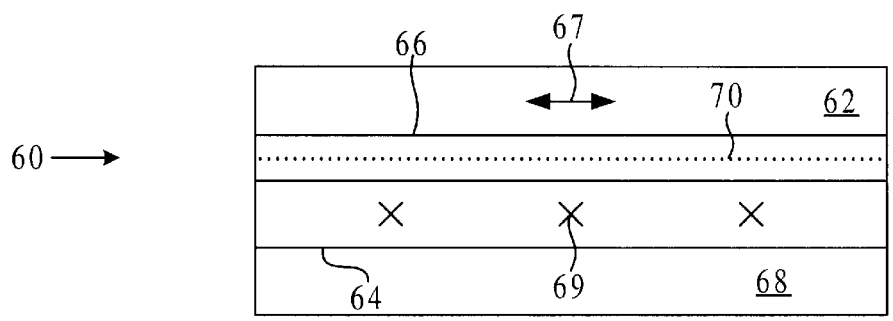
FIG. 2 is a cross-section of a SDT device having a plurality of magnetic particles disposed in a tunnel barrier layer that separates ferromagnetic layers having easy axes of magnetization substantially perpendicular to each other.

FIG. 2 shows a cross-section of a SDT device 60 having a plurality of magnetic particles 70 dispersed in a tunnel barrier layer 66. The device 60 includes a first ferromagnetic (FM) layer 62 and second FM layer 64 separated by the tunnel barrier layer 66. A pinning structure 68 constrains the direction of magnetization of the second FM layer 64. In response to an applied magnetic field, the magnetic moment of the first FM layer 62 changes direction, as shown by arrow 67, while the magnetic moment of the second FM layer 64 is pinned, as shown by cross marks, indicating a moment directed away from the viewer. In this embodiment, which may for example be used in a magnetic sensing device, an easy axis of magnetization of the first FM layer may be substantially perpendicular to that of the second FM layer 64, so that the second FM layer switches between low resistance and high resistance states. As long as the easy axes of magnetization of the first and second FM layers are more perpendicular than parallel, a linear change in resistance is facilitated.

Figure 3:
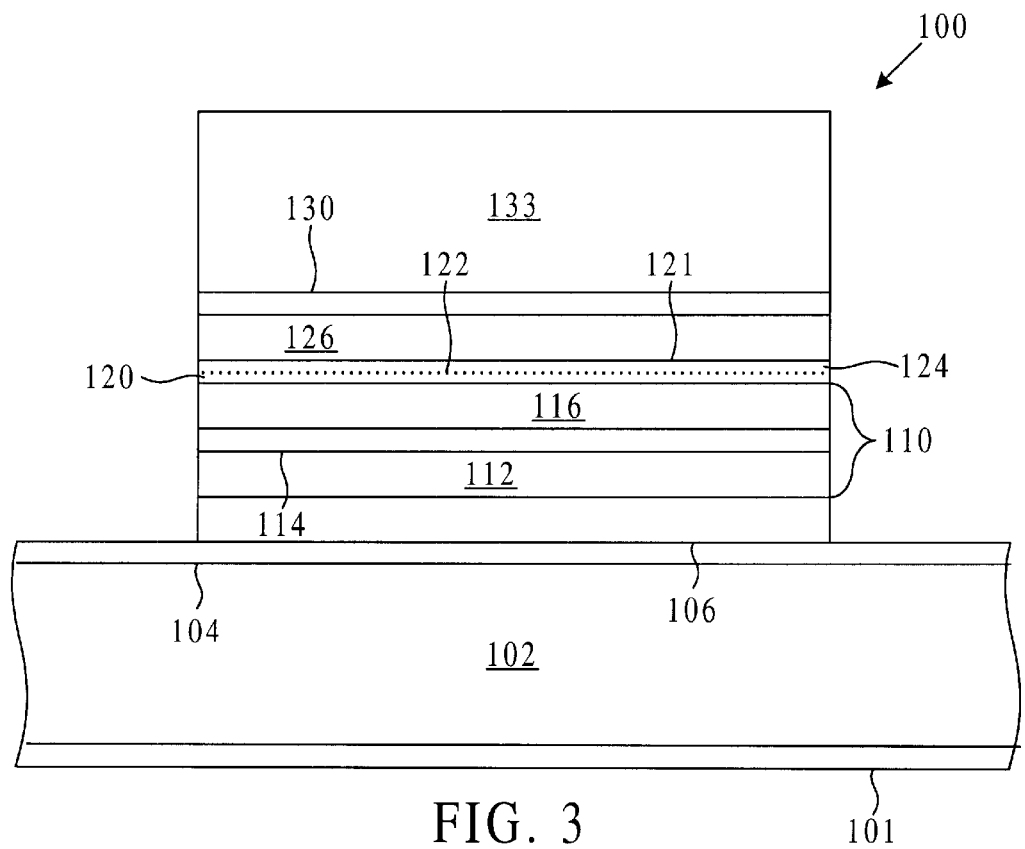
FIG. 3 is a cross-section of a SDT device having a plurality of magnetic particles disposed in a tunnel barrier layer and disposed between conductive leads.

FIG. 3 shows a cross-section of a portion of a SDT sensor 100 in accordance with one embodiment of the invention, such as may be employed in an information storage and retrieval device. Formation of SDT sensor 100 may occur on a wafer substrate such as AlTiC, SiC or Si, not shown, upon which a seed layer 101 of Ta has been deposited. A first or bottom lead 102 of electrically conductive material such as Cu or Au has been formed, and capped with another Ta seed layer 104. An electrically conductive layer 106 of AFM material was then formed on the seed layer 104. The AFM material may, for example, include IrMn, FeMn, NiMn, PdPtMn, NiFeCr/PtMn or NiFe/PtMn. A magnetically pinned structure 110 can then be formed of a sandwich of FM layers 112 and 116 that surround a very thin coupling layer 114 of Ru or similar elements. The FM layers 112 and 116, which may for example be formed of CoFe, are magnetically coupled with moments directed in opposite directions about coupling layer 114, with the moment of FM layer 112 additionally pinned by AFM layer 106. A single pinned layer may be alternatively employed instead of the three layer magnetically pinned structure 110.

A first SDT film 120 that may be between a single atomic layer and several or more nanometers in thickness, depending upon the desired application, is then deposited on the FM layer 116. The first SDT film 120 may be formed by depositing an initial layer, such as Al, Si, Mg, Ta or Hf on the FM layer 116, and then oxidizing or nitridizing the initial layer. Magnetic particles 122 are then deposited on and in some cases in the first SDT film 120, by sputtering or ion beam depoition. The magnetic particles 122 may range in size between individual atoms and clusters of atoms having a diameter of about 10 angstroms. In order to have properties of individual magnetic particles 122 it is desirable for this embodiment that the particles do not form a continuous layer atop the first SDT film 120. A second SDT film 124 that may be between a single atomic layer and several or more nanometers in thickness, depending upon the desired application, is then deposited on the magnetic particles 122 and the first SDT film 120. The second SDT film 124 may be formed by depositing an initial layer, such as Al, Si, Mg, Ta or Hf, and then oxidizing or nitridizing the initial layer.

Together the first SDT film 120, magnetic particles 122 and second SDT film 124 form a tunnel barrier layer 121 between pinned FM layer 116 and a free FM layer 126. The thickness of tunnel barrier layer 121 for a SDT head implementation may be between 5 Å and 5 nm, the additional thickness made possible by the increased magnetoresistive effect of the novel tunnel barrier layer 121. The layers 120 and 124 may be oxidized or nitridized by the same or different processes, as desired for a particular application. Depending upon the process and materials employed, layers 120 and 124 may be distinct or may be merged into the single layer 121. The atomic concentration of magnetic particles in a tunnel barrier layer such as layer 121 may range between less than one percent and about ten percent. The amount of dopants can be measured by various means, such as x-ray photoelectron spectroscopy (XPS), auger electron spectroscopy (AES), transmission electron microscopy (TEM), electron energy loss spectroscopy (EELS), parallel electron energy loss spectroscopy (PEELS), secondary ion mass spectroscopy (SIMS) or x-ray fluorescence (XRF).

After the tunneling barrier has been made, a free FM layer 126 is formed of materials such as CoFe, NiFe, CoNiFe, or multilayers of these materials. A capping layer 130 of Ta, Ru, Cr or NiFeCr may be used to prevent the oxidation of the free layer 126. Edges of the SDT device are then defined, for example by ion beam milling into a desirable structure, and a top lead 133 is formed, e.g., of Au or Cu. For an embodiment to be used as a magnetic sensor, for example in a read-write head, a hard bias material may be formed adjacent to edges of the free layer 126 to reduce Barkhausen noise. A similar technique can be applied to form a top SDT structure, i.e., by creating a pinned layer or layers after a SDT barrier, which is formed atop a free layer. Other variations of the sensor stack structure are also possible that include plural magnetic particles in a tunnel barrier region. For instance, some portions of a pinned or free layer may be intentionally oxidized or nitridized to form a nanooxide or nanonitride that can enhance the sensitivity.

Figure 4:
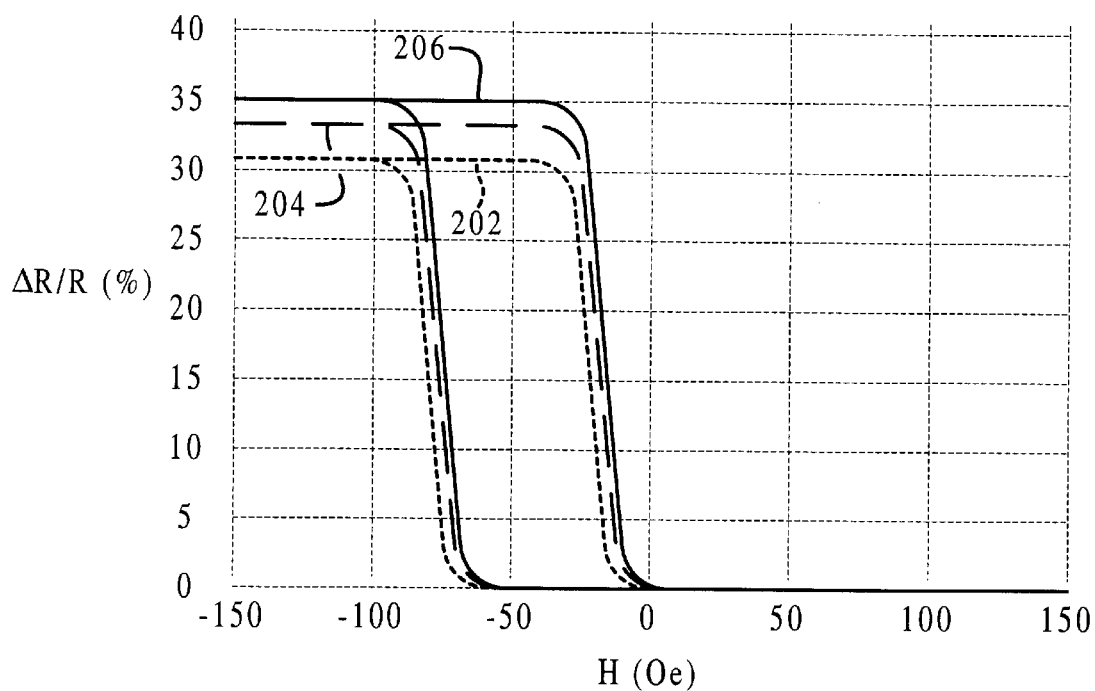
FIG. 4 is a plot of the magnetorestistance ($\Delta R/R$) of SDT devices having different amounts of magnetic particles contained in an alumina tunnel barrier layer.

FIG. 4 shows some hysteresis plots of the magnetoresistance ($\Delta R/R$) of SDT devices having different amounts of magnetic particles contained in an alumina tunnel barrier layer such as layer 121 of FIG. 3. In this example, curve 202 is a plot of ($\Delta R/R$) versus applied field H for a SDT device having no magnetic particles in the barrier layer. A maximum ($\Delta R/R$) for this device can be seen to be about 31%. Curve 204 is a plot of ($\Delta R/R$) versus applied field H for a SDT device having CoFe magnetic particles contained in a layer averaging 0.3 Å in thickness within the alumina barrier layer. A maximum ($\Delta R/R$) of about 33% for this device is higher than that of the SDT device having no magnetic particles. Curve 206 is a plot of ($\Delta R/R$) versus applied field H for a SDT device having CoFe magnetic particles contained in a layer averaging 0.5 Å in thickness within the barrier layer. A maximum ($\Delta R/R$) of about 35% for this device is significantly higher than that of the SDT device having no magnetic particles.

Figure 5:
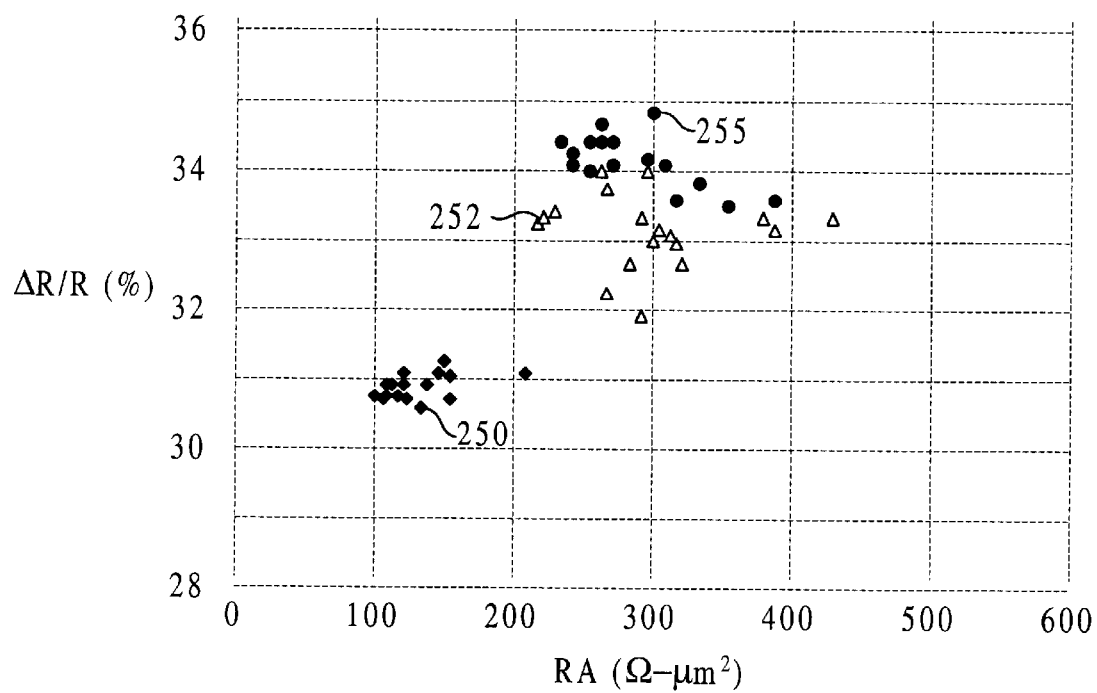
FIG. 5 is a plot of the magnetorestistance ($\Delta R/R$) versus a resistance-area product (RA) of SDT devices having different amounts of magnetic particles contained in an alumina tunnel barrier layer.

FIG. 5 is a plot of ($\Delta R/R$) versus a resistance-area product (RA) of SDT devices having different amounts of magnetic particles contained in an alumina tunnel barrier layer such as layer 121 of FIG. 3. The diamond-shaped data points 250 indicate $\Delta R/R$ and RA values for SDT devices having no magnetic particles in an alumina tunnel barrier layer such as layer 121 of FIG. 3. The triangle-shaped data points 252 indicate $\Delta R/R$ and RA values for SDT devices having CoFe magnetic particles contained in a layer averaging 0.3 Å in thickness within the alumina barrier layer. Both the $\Delta R/R$ and RA values show significant improvement over the values of the undoped barrier layer. The circle-shaped data points 255 indicate $\Delta R/R$ and RA values for SDT devices having CoFe magnetic particles contained in a layer averaging 0.5 Å in thickness within the alumina barrier layer. Even higher $\Delta R/R$ and RA values are evident for this group. Magnetic particles may also be made to diffuse through a dielectric tunnel barrier layer so that, for example, they can be found at various thicknesses of the layer.

Figure 6:
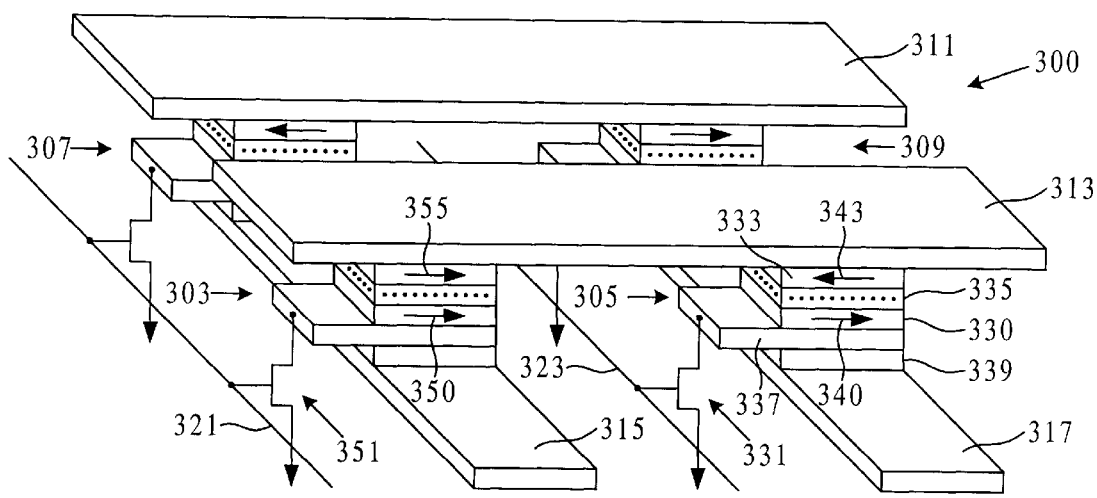
FIG. 6 is a schematic perspective view of plural SDT devices used as part of a solid-state memory such as an MRAM device.

FIG. 6 shows one embodiment using the SDT devices as part of a solid-state memory such as an MRAM device 300. In this example, four memory bits or cells 303, 305, 307 and 309 are shown as stacks of layers between conductive lines arranged to write and read data to and from each cell. Lines 311 and 313, which may be called bit lines, are used for both reading and writing and are in electrical as well as magnetic communication with the cells. Lines 315 and 317, which may be called digit lines, are used only for writing, and are in magnetic communication with but electrically isolated from the cells. Word lines 321 and 323 are in electrical communication with the cells via transistors, and are used only for reading.

Each of the cells 303, 305, 307 and 309 includes a pinned FM layer, a free FM layer and a tunnel barrier layer containing magnetic particles. Focusing on cell 305 provides an example for the operation of various cells. Cell 305 has a pinned structure or layer 330, a free layer 333 and a tunnel barrier layer 335 containing magnetic particles. A transistor 331 controlled by word line 323 is coupled to a conductive lead 337 adjoining the pinned structure 330. The conductive lead 337 is electrically isolated from digit line 317 by insulation layer 339.

Pinned layer 330 has a magnetic moment indicated by arrow 340, and free layer 333 has a magnetic moment indicated by arrow 343. A magnetic state is written to cell 305 by flowing current through lines 313 and 317 in an amount sufficient to switch the magnetic moment of the free layer 333. Current in line 313 creates a magnetic field along a hard axis of free layer 333 and current in line 317 creates a magnetic field along an easy axis of free layer 333, the combined fields being sufficient to switch the magnetic moment of the cell, whereas either field alone is insufficient to switch the cell. Arrow 343 is antiparallel to arrow 340, indicating that free layer 333 has a magnetic moment antiparallel to that of pinned layer 330. Turning on transistor 331 to sense the state of cell 305 would result in a high voltage state (when a constant current is applied) through the transistor, which may indicate for instance that a value of zero has been stored in cell 305.

Cell 303, on the other hand, has a free layer with a magnetic moment parallel to that of its pinned layer, as indicated by arrows 350 and 355. Turning on transistor 351 to sense the state of cell 305 would result in a low voltage state (when a constant current is applied) through the transistor, which may indicate for instance that a value of one has been stored in cell 305. It may also be possible for such SDT devices to have more than two distinct states or levels of resistance, allowing more information to be stored in each cell or MRAM module.

Figure 7:
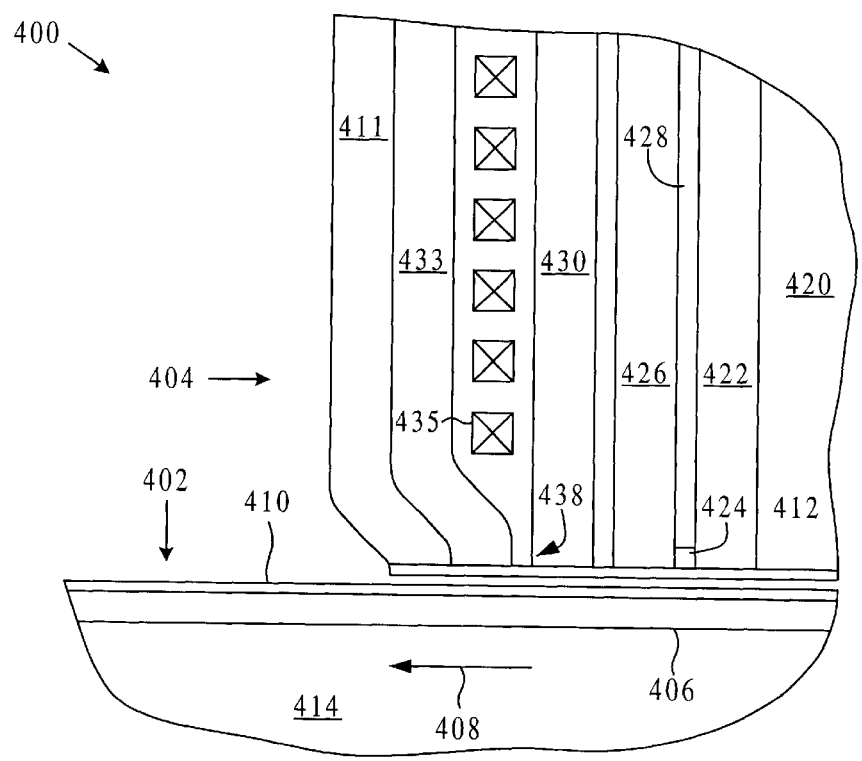
FIG. 7 is a cutaway cross-sectional view of an SDT device used in an information storage system such as a hard disk drive.

FIG. 7 shows one embodiment using an SDT device as part of an information storage system such as a hard disk drive 400. A rigid disk 402 spins rapidly in a direction shown by arrow 408 relative to a head 404 containing a transducer for reading and writing magnetic patterns on a media layer 406 of the disk. A hard coating layer 410 forms a surface of the disk 402 protecting the media layer 406 from the head 404, and a similar hard coating 412 forms a surface of the head 404 to protect the transducer from the disk, while another hard coating 411 forms a trailing end of the head. The disk includes a substrate 414 upon which the media layer 406 may be formed, and the disk may include additional layers, not shown. The head also includes a substrate 420 upon which the transducer has been formed, and may include additional layers, not shown.

A first shield 422 has been formed over the substrate, the shield including ferromagnetic material for shielding a SDT sensor 424 from magnetic signals that are not directly opposite the sensor 424 in the media layer 406, as well as conductive material for providing electrical current to the sensor 424. A second shield 426 is separated from the first shield 422 by a dielectric layer 428, the shields connected by the sensor 424. The second shield 426 also includes ferromagnetic material for shielding the sensor 424 from magnetic signals that are not directly opposite the sensor 424 in the media layer 406, as well as conductive material for providing electrical current to the sensor 424. As the media layer 406 travels past the sensor 424 in the direction of arrow 408, the sensor reads magnetic signals from the media layer.

First and second ferromagnetic yoke layer 430 and 433 are magnetically coupled together in a loop that is inductively driven by current in coil winding sections 435. The magnetic loop is broken by a nonferromagnetic gap 438, so that some magnetic flux propagating around the loop is diverted to the media layer 406 of the disk 402, writing a magnetic signal to the media layer. This magnetic signal can later be read by the MR sensor, which may have an increased resolution due to subnanometer magnetic particles contained in a tunnel barrier layer.

Although the above description has focused on illustrating SDT devices for use with information storage systems and solid-state memory, other devices can be formed in accordance with the present invention. Moreover, other embodiments and modifications of this invention will be apparent to persons of ordinary skill in the art in view of these teachings. Therefore, this invention is limited only by the following claims, which include all such embodiments and modifications when viewed in conjunction with the above specification and accompanying drawings.

What is claimed is:

1. A device comprising:
    a first ferromagnetic layer having a magnetic moment with a direction that is substantially fixed in response to an applied magnetic field;
    a second ferromagnetic layer having a magnetic moment with a direction that is variable in response to said applied magnetic field; and
    a tunnel barrier layer separating said first and second ferromagnetic layers and having a thickness of less than ten nanometers, said tunnel barrier layer containing primarily dielectric material and containing a plurality of ferromagnetic particles that are separated from said first and second ferromagnetic layers.

2. The device of claim 1, wherein said device is a part of an electromagnetic transducer.

3. The device of claim 1, wherein said device is a part of a solid-state memory.

4. The device of claim 1, wherein said tunnel barrier layer includes aluminum oxide.

5. The device of claim 1, wherein said ferromagnetic particles have a diameter that is less than one nanometer.

6. The device of claim 1, wherein said ferromagnetic particles include cobalt, iron or nickel.

7. The device of claim 1, wherein said ferromagnetic particles include compound molecules of cobalt, iron or nickel.

8. The device of claim 1, wherein said second ferromagnetic layer has an easy axis of magnetization that is substantially parallel to said magnetic moment direction of said first ferromagnetic layer.

9. The device of claim 1, wherein said second ferromagnetic layer has an easy axis of magnetization that is substantially perpendicular to said magnetic moment direction of said first ferromagnetic layer.

10. The device of claim 1, wherein at least one of said first and second ferromagnetic layers includes a half-metallic magnet.

11. A device comprising:
    a first ferromagnetic layer having a magnetic moment with a direction that is substantially fixed in response to an applied magnetic field;
    a second ferromagnetic layer having a magnetic moment with a direction that is variable in response to said applied magnetic field;
    a dielectric layer separating said first and second ferromagnetic layers and having a thickness of less than ten nanometers; and
    a plurality of ferromagnetic particles adjoining said dielectric layer and separated from said first and second ferromagnetic layers.

12. The device of claim 11, wherein said device is a part of an electromagnetic transducer.

13. The device of claim 11, wherein said device is a part of a solid-state memory.

14. The device of claim 11, wherein said dielectric layer includes aluminum oxide.

15. The device of claim 11, wherein said ferromagnetic particles have a diameter that is less than one nanometer.

16. The device of claim 11, wherein said ferromagnetic particles include cobalt, iron or nickel.

17. The device of claim 11, wherein said ferromagnetic particles include compound molecules of cobalt, iron or nickel.

18. The device of claim 11, wherein said second ferromagnetic layer has an easy axis of magnetization that is substantially parallel to said magnetic moment direction of said first ferromagnetic layer.

19. The device of claim 11, wherein said second ferromagnetic layer has an easy axis of magnetization that is substantially perpendicular to said magnetic moment direction of said first ferromagnetic layer.

20. The device of claim 11, wherein at least one of said first and second ferromagnetic layers includes a half-metallic magnet.

21. A device comprising:
    a first electrode including a first ferromagnetic layer having a magnetic moment with a direction that is substantially fixed in response to an applied magnetic field;
    a second electrode including a second ferromagnetic layer having a magnetic moment with a direction that is variable in response to said applied magnetic field;
    a dielectric layer separating said first and second ferromagnetic layers and having a thickness of less than ten nanometers; and
    a plurality of ferromagnetic particles contained in said dielectric layer and separated from said first and second ferromagnetic layers,
    wherein an electrical current between said electrodes is a function of an orientation of said second magnetic moment relative to that of said first magnetic moment.

22. The device of claim 21, wherein said device is a part of an electromagnetic transducer.

23. The device of claim 21, wherein said device is a part of a solid-state memory.

24. The device of claim 21, wherein said dielectric layer includes aluminum oxide.

25. The device of claim 21, wherein said ferromagnetic particles have an atomic concentration that is less than ten percent of said dielectric layer.

26. The device of claim 21, wherein said ferromagnetic particles include cobalt, iron or nickel.

27. The device of claim 21, wherein said ferromagnetic particles include compound molecules of cobalt, iron or nickel.

28. The device of claim 21, wherein said second ferromagnetic layer has an easy axis of magnetization that is substantially parallel to said magnetic moment direction of said first ferromagnetic layer.

29. The device of claim 21, wherein said second ferromagnetic layer has an easy axis of magnetization that is substantially perpendicular to said magnetic moment direction of said first ferromagnetic layer.

30. The device of claim 21, wherein at least one of said first and second ferromagnetic layers includes a half-metallic magnet.

* * * * *